(12) United States Patent
Harafuji et al.

(10) Patent No.: US 8,686,544 B2
(45) Date of Patent: Apr. 1, 2014

(54) SEMICONDUCTOR DEVICE

(75) Inventors: Kenji Harafuji, Kagawa (JP); Kimihito Kuwabara, Kyoto (JP)

(73) Assignee: Panasonic Corporation, Osaka (JP)

( * ) Notice: Subject to any disclaimer, the term of this patent is extended or adjusted under 35 U.S.C. 154(b) by 992 days.

(21) Appl. No.: 11/598,046

(22) Filed: Nov. 13, 2006

(65) Prior Publication Data
US 2007/0108532 A1    May 17, 2007

(30) Foreign Application Priority Data

Nov. 16, 2005  (JP) .................................. 2005-330923

(51) Int. Cl.
*H01L 23/495*   (2006.01)

(52) U.S. Cl.
USPC .................... 257/669; 257/778; 257/E27.006

(58) Field of Classification Search
USPC .......... 257/374, 778, 669, 108, 785, E27.006, 257/E29.324, E21.48, E21.519
See application file for complete search history.

(56) References Cited

U.S. PATENT DOCUMENTS

| | | | | |
|---|---|---|---|---|
| 4,520,413 | A * | 5/1985 | Piotrowski et al. | 360/328 |
| 4,792,476 | A * | 12/1988 | Numata et al. | 428/209 |
| 6,344,663 | B1 | 2/2002 | Slater, Jr. et al. | |
| 6,929,992 | B1 * | 8/2005 | Djomehri et al. | 438/199 |
| 7,022,561 | B2 * | 4/2006 | Huang et al. | 438/197 |
| 2003/0024723 | A1 * | 2/2003 | Igarashi et al. | 174/52.1 |
| 2003/0181005 | A1 * | 9/2003 | Hachimine et al. | 438/231 |
| 2004/0037179 | A1 * | 2/2004 | Lee | 369/47.1 |
| 2004/0147047 | A1 * | 7/2004 | Cross et al. | 438/3 |
| 2004/0251479 | A1 * | 12/2004 | Tsutsui et al. | 257/249 |
| 2005/0093078 | A1 * | 5/2005 | Chan et al. | 257/374 |
| 2005/0112817 | A1 * | 5/2005 | Cheng et al. | 438/219 |
| 2005/0156208 | A1 * | 7/2005 | Lin et al. | 257/288 |
| 2005/0285137 | A1 * | 12/2005 | Satoh | 257/178 |
| 2005/0285140 | A1 * | 12/2005 | Ko et al. | 257/192 |
| 2006/0038281 | A1 * | 2/2006 | Colgan et al. | 257/706 |
| 2006/0118880 | A1 * | 6/2006 | Komoda | 257/369 |
| 2006/0228848 | A1 * | 10/2006 | Chan et al. | 438/199 |
| 2007/0018328 | A1 * | 1/2007 | Hierlemann et al. | 257/762 |

FOREIGN PATENT DOCUMENTS

| | | |
|---|---|---|
| EP | 511718 A2 * | 11/1992 |
| JP | 64-076755 | 3/1989 |
| JP | 09-246537 | 9/1997 |
| JP | 9-321307 | 12/1997 |
| JP | 2000-181804 | 6/2000 |
| JP | 2000-508477 | 7/2000 |
| JP | 2003-078116 | 3/2003 |
| JP | 2003-273240 | 9/2003 |
| JP | 2004-172478 | 6/2004 |
| JP | 2005-005633 | 1/2005 |
| WO | 2004/081982 | 9/2004 |

* cited by examiner

*Primary Examiner* — Cuong Q Nguyen
*Assistant Examiner* — Yosef Gebreyesus
(74) *Attorney, Agent, or Firm* — Panasonic Patent Center

(57) ABSTRACT

It is possible to realize the following package structure. That is, a structure for applying a stress to a channel region is provided for a semiconductor chip itself. In a package manufacturing process, a low thermal expansion coefficient film is formed on a circuit face of an Si chip. Thus, distribution and magnitude of a desired stress can be secured for a channel region of a MOSFET in a mounted chip even after performance of the package manufacturing process. As a result, a mobility is increased and current driving power is enhanced.

14 Claims, 17 Drawing Sheets nMOSFET pMOSFET

FIG. 7
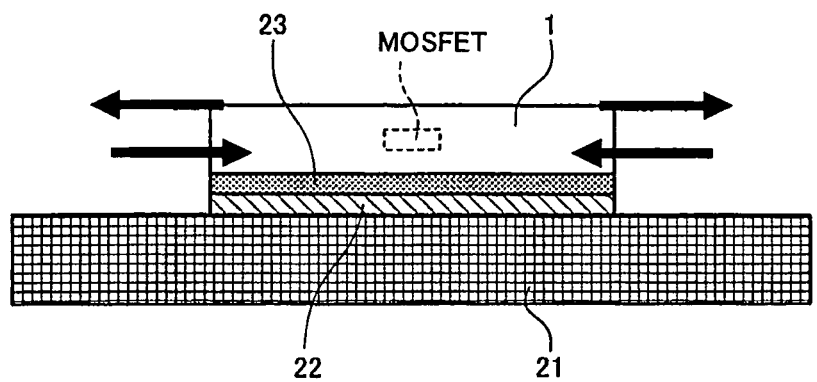
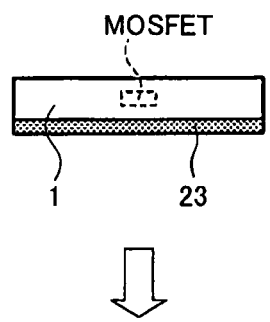
FIG. 8A
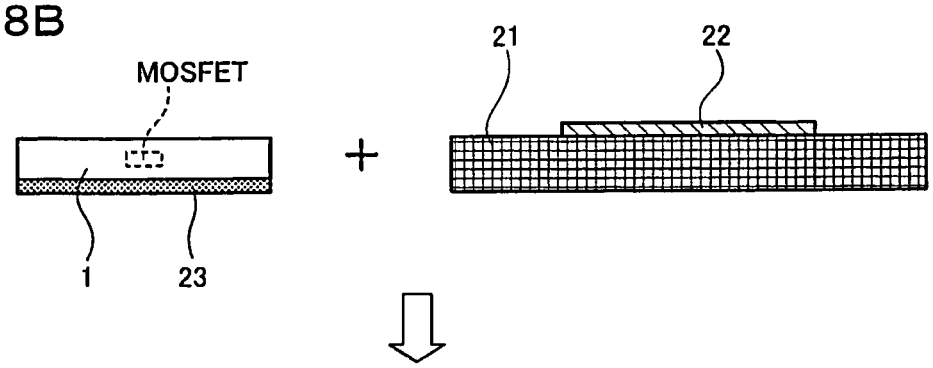
FIG. 8B
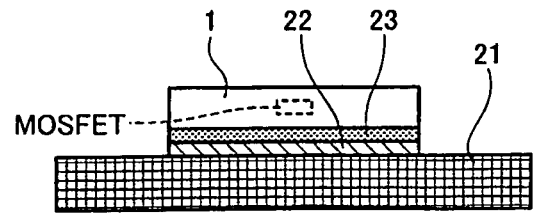
FIG. 8C

SEMICONDUCTOR DEVICE

BACKGROUND OF THE INVENTION (1) Field of the Invention

The present invention relates to a semiconductor device improving a carrier mobility of a channel, thereby to realize a high-speed operation.

(2) Description of the Related Art

In a growing trend to finely fabricate an Si-based MOSFET, it is necessary to improve electrical characteristics such as a carrier mobility of a channel in order to realize a high-speed operation and low power consumption for a MOSFET. In Shinichi Takagi, "Metal-Oxide-Semiconductor (MOS) Device Technologies Using Si/SiGe Hetero-Interfaces", Applied Physics, Vol. 72, No. 3 (2003) and J-S Lim et al., IEEE Electron Devices Letters, Vol. 25, No. 11 (2004), some candidates for a MOSFET channel structure are proposed. For example, as illustrated in FIG. 14, an SiGe layer 51 is used as a substrate. Herein, the SiGe layer 51 is formed above an Si crystal 50 and is subjected to lattice relaxation so as to have a lattice constant higher than that of the Si crystal 50. Then, a strained Si 52 is epitaxially grown on the SiGe substrate 51 and is used as a channel. In many cases, SiGe is subjected to lattice relaxation in such a manner that an inclined-type SiGe buffer layer 53 having a Ge concentration increased from 0% to a desired value is formed immediately below the SiGe layer 51. Further, as illustrated in FIG. 15, a buried insulating layer 55 may be formed between the inclined-type SiGe buffer layer 53 and the Si substrate. Alternatively, as illustrated in a left side of FIG. 23, a first-order internal stress film 60 is deposited immediately on a source region (S), a gate region (G) and a drain region (D) of an MOSFET (MISFET). Herein, the first-order internal stress film 60 is, for example, an SiN film that generates a tensile force. With this first-order internal stress film 60, Si in an Si channel region is restrained. Still alternatively, as illustrated in FIG. 16, an SiGe layer 151 is used as a channel. The former two methods are adopted for an nMOSFET and a pMOSFET, and the latter method is adopted for a pMOSFET. Among the aforementioned three methods, as strained Si, the former two methods are positively studied in recent years. Physically, strained Si is obtained because a band structure of Si is varied, degeneration of a band is released and an effective mass is changed. In terms of phenomenology, a linear combination of three components of a stress vector to be applied to a channel region with a constant called a piezoparameter expresses a change in carrier mobility of a channel with respect to an applied stress.

As for a MOSFET having a gate length of 100 nm, device simulation is carried out using a piezoparameter; thus, a relation between a stress and a change in mobility is obtained. FIGS. 17 to 19 show results of the relation as a graph, respectively. In each of FIGS. 17 to 19, a horizontal axis represents magnitude of each component of a stress which is applied to a channel region and is expressed in a unit of "MPa", and a vertical axis represents a change amount of a mobility in a unit of "%". In addition, a positive value of the stress represents a tensile stress, and a negative value thereof represents a compressive stress. In the respective graphs, black circle marks and a solid line represent results on an nMOSFET, and black triangle marks and a broken line represent results on a pMOSFET. FIGS. 17, 18 and 19 show a dependency on a stress Sx in a gate length direction (an X direction) on a (001) plane which is a main surface of an Si substrate, a dependency on a stress Sy in a direction perpendicular to the gate length direction (a Y direction), that is, a gate width direction on the (001) plane which is the main surface of the Si substrate and a dependency on a stress Sz in a direction perpendicular to the main surface of the Si substrate (a Z direction), respectively.

The following description is summarized from the results shown in FIGS. 17 to 19. When a stress in a direction shown by an arrow in FIG. 20 on the (001) plane which is the main surface of the Si substrate is applied to a channel region of a MOSFET, a carrier mobility is increased. In other words, an nMOSFET and a pMOSFET are different from each other in a direction of applying a stress.

As for an nMOSFET, when a tensile stress is applied to a channel region in a gate length direction extending from a source (S) toward a drain (D) (an X direction: a [110] direction in this case) on a main surface of an Si substrate, a mobility is increased. In contrast, a compressive stress is applied similarly, the mobility is decreased. As shown in FIG. 17, a change in mobility is increased almost linearly with respect to the tensile stress Sx to be applied. Likewise, when a tensile stress is applied to the channel region in a direction perpendicular to the gate length direction (a Y direction: a [−110] direction in this case) on the main surface of the Si substrate, the mobility is increased. In contrast, when a compressive stress is applied similarly, the mobility is decreased. Although not illustrated in FIG. 20, when a stress to be applied in a direction perpendicular to the main surface of the Si substrate (a Z direction) is applied in a compressive direction in addition to the stresses applied in the X and Y directions on the main surface of the Si substrate, the mobility is increased as shown in FIG. 19. In contrast, when such a stress is applied in a tensile direction, the mobility is decreased.

As for a pMOSFET, when a compressive stress is applied to a channel region in a gate length direction extending from a source (S) toward a drain (D) (an X direction: a [110] direction in this case) on a main surface of an Si substrate, a mobility is increased. In contrast, a tensile stress is applied similarly, the mobility is decreased. As shown in FIG. 17, a change in mobility is increased almost linearly with respect to the compressive stress Sx to be applied. Likewise, when a tensile stress is applied to the channel region in a direction perpendicular to the gate length direction (a Y direction: a [−110] direction in this case) on the main surface of the Si substrate, the mobility is increased. In contrast, when a compressive stress is applied similarly, the mobility is decreased. Although not illustrated in FIG. 20, when a stress to be applied in a direction perpendicular to the main surface of the Si substrate (a Z direction) is applied in a tensile direction in addition to the stresses applied in the X and Y directions on the main surface of the Si substrate, the mobility is increased as shown in FIG. 19. In contrast, when such a stress is applied in a compressive direction, the mobility is decreased. As for the pMOSFET, however, a change in mobility with respect to the stress applied in the Z direction (a vertical direction) is much smaller than that in the nMOSFET.

As described above, an nMOSFET and a pMOSFET are different from each other in a direction of applying a stress for increasing a mobility. In view of the aforementioned facts, conventionally, the following semiconductor devices have been proposed in order to increase a mobility of a MOSFET in a chip and to enhance current driving power.

JP09-321307A discloses a semiconductor device illustrated in FIG. 21. The semiconductor device includes an SiGe layer 72 serving as a strain applying semiconductor layer, a buried insulating layer 73 (an $SiO_2$ layer in this case) and a strained Si layer 74 serving as a channel layer. Herein, the buried insulating layer 73 is formed so as to divide the SiGe layer 72 in a vertical direction. The strained Si layer 74 is formed on the SiGe layer 72. In addition, the buried insulating layer 73 is formed such that a thickness of the SiGe layer 72 becomes thin. Prior to formation of the strained Si layer 74, the SiGe layer 72 is subjected to heat treatment in order to reduce defects such as dislocation to be generated in the SiGe layer 72, upon formation of the SiGe layer 72 and the buried insulating layer 73.

JP2003-078116A discloses a semiconductor device illustrated in FIG. 22. The semiconductor device has a lamination structure that a first SiGe layer 114 is formed on a buried insulating layer 121 by a lamination method. Thereafter, a second SiGe layer 141 having a Ge concentration higher than that of the first SiGe layer 114 is formed on the first SiGe layer 114 and, then, an Si layer 142 is formed on the second SiGe layer 141. The Si layer 142 is turned into a strained Si layer by a difference in lattice constant from the second SiGe layer 141 serving as a base.

JP2005-005633A discloses a semiconductor device illustrated in FIG. 23. The semiconductor device includes a first-order internal stress film 60 and a second-order internal stress film 61. Herein, the first-order internal stress film 60 is formed on a source region and a drain region of an nMISFET and is made of a silicon nitride. The second-order internal stress film 61 is formed on a source region and a drain region of a pMISFET and is made of a TEOS. The first-order internal stress film 60 generates a tensile stress in an electron moving direction in a channel region of the nMISFET; thus, a mobility of an electron is enhanced. Moreover, the second-order internal stress film 61 generates a compressive stress in a hole moving direction in a channel region of the pMISFET; thus, a mobility of a hole is enhanced.

In a growing trend to finely fabricate an Si-based MOSFET, it is necessary to improve electrical characteristics such as a carrier mobility of a channel in order to realize a high-speed operation and low power consumption for a MOSFET. Therefore, as described above, in order to increase a carrier mobility of a channel, a structural devisal is made in a semiconductor chip manufacturing process so as to apply a suitable stress to a channel region. However, even when a stress generation structure in a semiconductor chip is optimized, deformation such as warpage derived from a thermal history in a package manufacturing process occurs at the semiconductor chip and a compressive stress due to the deformation is generated on an Si chip by a difference between laminated members in coefficient of thermal expansion, Young's modulus, or Poisson's ratio. Consequently, there arises a problem that an optimal stress generated in the semiconductor chip manufacturing process and spatial distribution thereof are deoptimized, so that a channel region cannot obtain magnitude of a desired stress and spatial distribution thereof.

SUMMARY OF THE INVENTION

In view of the aforementioned problems, it is an object of the present invention to realize the following package structure. That is, distribution and magnitude of a desired stress can be secured for a channel region of a MOSFET in a mounted chip even after performance of a package manufacturing process; thus, a mobility is increased and current driving power is enhanced.

In order to accomplish this object, the present invention provides a semiconductor device comprising: an n-type MOSFET and a p-type MOSFET each mounted on a circuit face of an Si chip; and a low thermal expansion coefficient film formed on one of an entire region and a partial region of the circuit face of the Si chip, the low thermal expansion coefficient film having a coefficient of thermal expansion lower than that of Si, wherein the Si chip having the low thermal expansion coefficient film formed thereon is attached to one of a substrate and a frame and, then, is sealed with a resin, thereby to manufacture a package.

In the semiconductor device according to the present invention, the Si chip is flip-chip connected to one of the substrate and the frame.

In the semiconductor device according to the present invention, each of the n-type MOSFET and the p-type MOSFET includes a channel region having a stress applied thereto.

In the semiconductor device according to the present invention, a sum of components of a stress derived from the stress applied to the channel region of the n-type MOSFET and generated on the channel region, components of a stress derived from the stress applied to the channel region of the p-type MOSFET and generated on the channel region, components of a stress derived from the low thermal expansion coefficient film and generated on the channel region of the n-type MOSFET and components of a stress derived from the low thermal expansion coefficient film and generated on the channel region of the p-type MOSFET turns into a tensile stress to be applied to the n-type MOSFET in a gate length direction of the channel region, a tensile stress to be applied to the n-type MOSFET in a gate width direction perpendicular to the gate length direction, a compressive stress to be applied to the p-type MOSFET in a gate length direction of the channel region and a tensile stress to be applied to the p-type MOSFET in a gate width direction perpendicular to the gate length direction.

In the semiconductor device according to the present invention, the low thermal expansion coefficient film is formed on the circuit face of the Si chip so as to extend from end to end of the Si chip in the gate width direction of the p-type MOSFET and to extend by a predetermined width from a center of the Si chip in the gate length direction of the p-type MOSFET.

In the semiconductor device according to the present invention, the circuit face of the Si chip is a {100} plane and the gate length direction is a <011> direction.

In the semiconductor device according to the present invention, the low thermal expansion coefficient film is made of a material selected from the group consisting of $SiO_2$, SiOC, SiN, SiC and SiCN.

In the semiconductor device according to the present invention, the low thermal expansion coefficient film is formed on the circuit face of the Si chip at an almost maximum temperature in a package manufacturing process.

In the semiconductor device according to the present invention, the n-type MOSFET includes a first stress generation structure for generating a tensile stress in the gate length direction and generating a tensile stress in the gate width direction perpendicular to the gate length direction, and the p-type MOSFET includes a second stress generation structure for generating a compressive stress in the gate length direction and generating a tensile stress in the gate width direction perpendicular to the gate length direction.

In the semiconductor device according to the present invention, the first stress generation structure has a strained Si used as a channel region and grown on an SiGe crystal subjected to lattice relaxation, the second stress generation structure has a strained Si used as a channel region and grown on an SiGe crystal subjected to lattice relaxation, and buried-type strain induction structures each generating a compressive stress in the gate length direction are formed at both sides of a source region and a drain region of the p-type MOSFET in the gate width direction.

In the semiconductor device according to the present invention, the buried-type strain induction structure is one of a silicon oxide film and a piezoelectric element.

In the semiconductor device according to the present invention, an internal stress film made of a silicon nitride is formed on a source region and a drain region of the n-type MOSFET, and an internal stress film made of a TEOS is formed on a source region and a drain region of the p-type MOSFET.

In the semiconductor device according to the present invention, a piezoelectric element is formed on one of an entire region and a partial region of the circuit face of the Si chip.

BRIEF DESCRIPTION OF THE DRAWINGS

FIG. 7 is a sectional view illustrating a semiconductor device according to a second embodiment of the present invention;

FIGS. 8A to 8C are sectional views each illustrating a package manufacturing process of the semiconductor device according to the second embodiment of the present invention;

DESCRIPTION OF THE PREFERRED EMBODIMENTS

The present invention provides a semiconductor device realizing the following package structure. That is, a low thermal expansion coefficient film having a coefficient of thermal expansion lower than that of Si is formed entirely or partially on a circuit face of an Si chip. A sum of components of a stress generated by a stress generation structure formed in a semiconductor chip manufacturing process and components of a stress generated by the low thermal expansion coefficient film formed in a package manufacturing process turns into a tensile stress to be applied in a gate length direction of an nMOSFET, a tensile stress to be applied in a gate width direction perpendicular to the gate length direction of the nMOSFET, a compressive stress to be applied in a gate length direction of a pMOSFET and a tensile stress to be applied in a gate width direction perpendicular to the gate length direction of the pMOSFET. Thus, magnitude of a desired stress and spatial distribution thereof can be secured for a channel region of a MOSFET in a mounted chip even after performance of the package manufacturing process. As a result, a mobility is increased and current driving power is enhanced.

Figure 1:
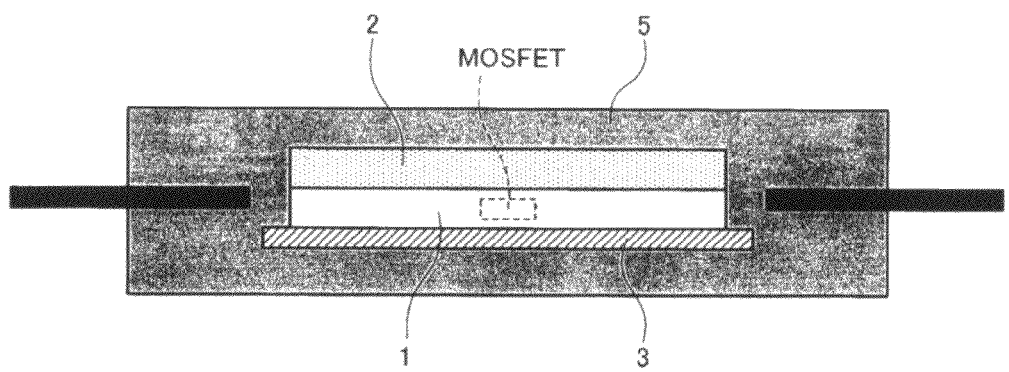
FIG. 1 is a sectional view illustrating a semiconductor device according to a first embodiment of the present invention.

Hereinafter, description will be given of preferred embodiments of the present invention with reference to the drawings.
First Embodiment FIG. 1 is a sectional view illustrating a semiconductor device according to a first embodiment of the present invention. Herein, as an example, the semiconductor device has a package structure of a QFP (Quad Flat Package) type. This package structure is obtained as follows. An nMOSFET and a pMOSFET are mounted on a circuit face of an Si chip 1. Further, a thin film 2 made of a material having a coefficient of thermal expansion lower than that of Si (hereinafter, referred to as "low thermal expansion coefficient film") is formed entirely on the circuit face of the Si chip 1. The resultant Si chip 1 is attached to a frame 3. Then, the Si chip 1 and the frame 3 are integrally sealed with a resin 5.

Figure 2A:
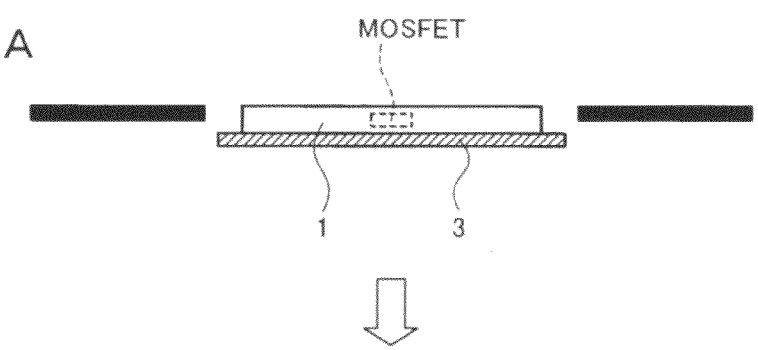
FIGS. 2A to 2C are sectional views each illustrating a package manufacturing process of the semiconductor device according to the first embodiment of the present invention.
Figure 2B:
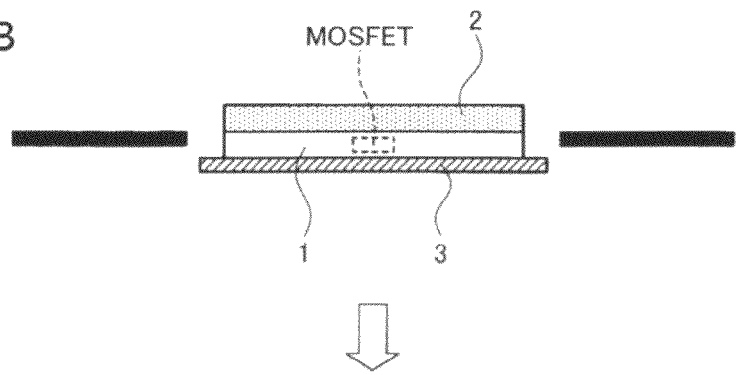
Figure 2C:
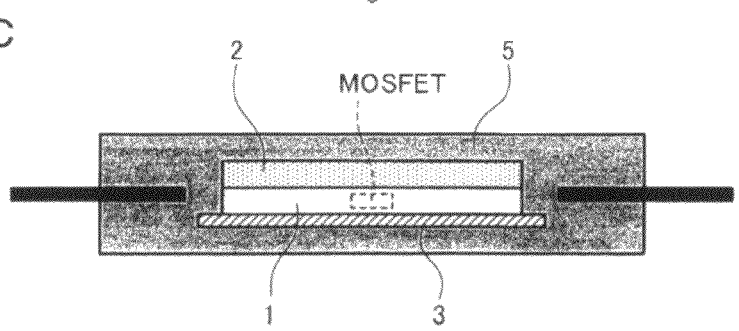
Figure 3:
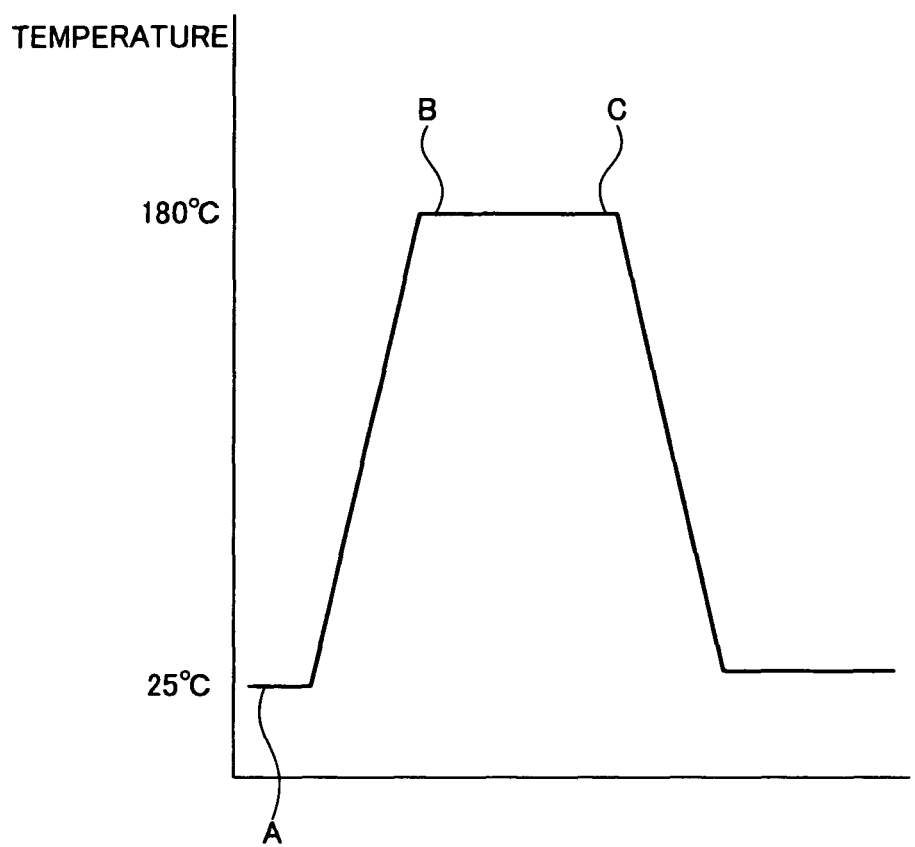
FIG. 3 shows a thermal history in the package manufacturing process of the semiconductor device according to the first embodiment of the present invention.

FIGS. 2A to 2C are sectional views each illustrating a package manufacturing process of the semiconductor device according to the first embodiment of the present invention. FIG. 3 shows a thermal history in the package manufacturing process of the semiconductor device according to the first embodiment of the present invention. As illustrated in FIG. 2A, the Si chip 1 having a thickness of 150 nm is attached to the frame 3 made of Cu at a normal temperature (for example, 25° C.: a portion A in FIG. 3). Thereafter, as illustrated in FIG. 2B, the Si chip 1 attached to the frame 3 is raised in temperature to a sealing temperature with a resin. Herein, the temperature of the Si chip 1 is increased to 180° C. (a portion B in FIG. 3). Then, the low thermal expansion coefficient film 2, which has a thickness of 100 nm and is made of SiC, is sufficiently relaxed at this temperature, and is formed on the circuit face of the Si chip with this temperature being kept (a portion C in FIG. 3). Further, as illustrated in FIG. 2C, the Si chip 1, the low thermal expansion coefficient film 2 and the frame 3 are integrally sealed with the resin 5 and, then, the temperature is decreased to the normal temperature (for example, 25° C.). Herein, it is especially effective that the low thermal expansion coefficient film 2 is formed on the circuit face of the Si chip 1 at an almost maximum temperature in the package manufacturing process.

If the low thermal expansion coefficient film 2 is not formed on the circuit face of the Si chip 1, the following disadvantage is caused. That is, when the temperature is decreased to the normal temperature (for example, 25° C.), a compressive strain on a main surface of an Si substrate is applied to the entire circuit face of the Si chip 1 due to shrinkage on curing of the resin 5. Consequently, the compressive strain is also applied to a channel region of the nMOSFET and that of the pMOSFET. However, according to the first embodiment of the present invention, since the low thermal expansion coefficient film 2 is formed on the circuit face of the Si chip 1, a tensile strain on the main surface of the Si substrate can be applied to the entire circuit face of the Si chip 1.

Figure 20:
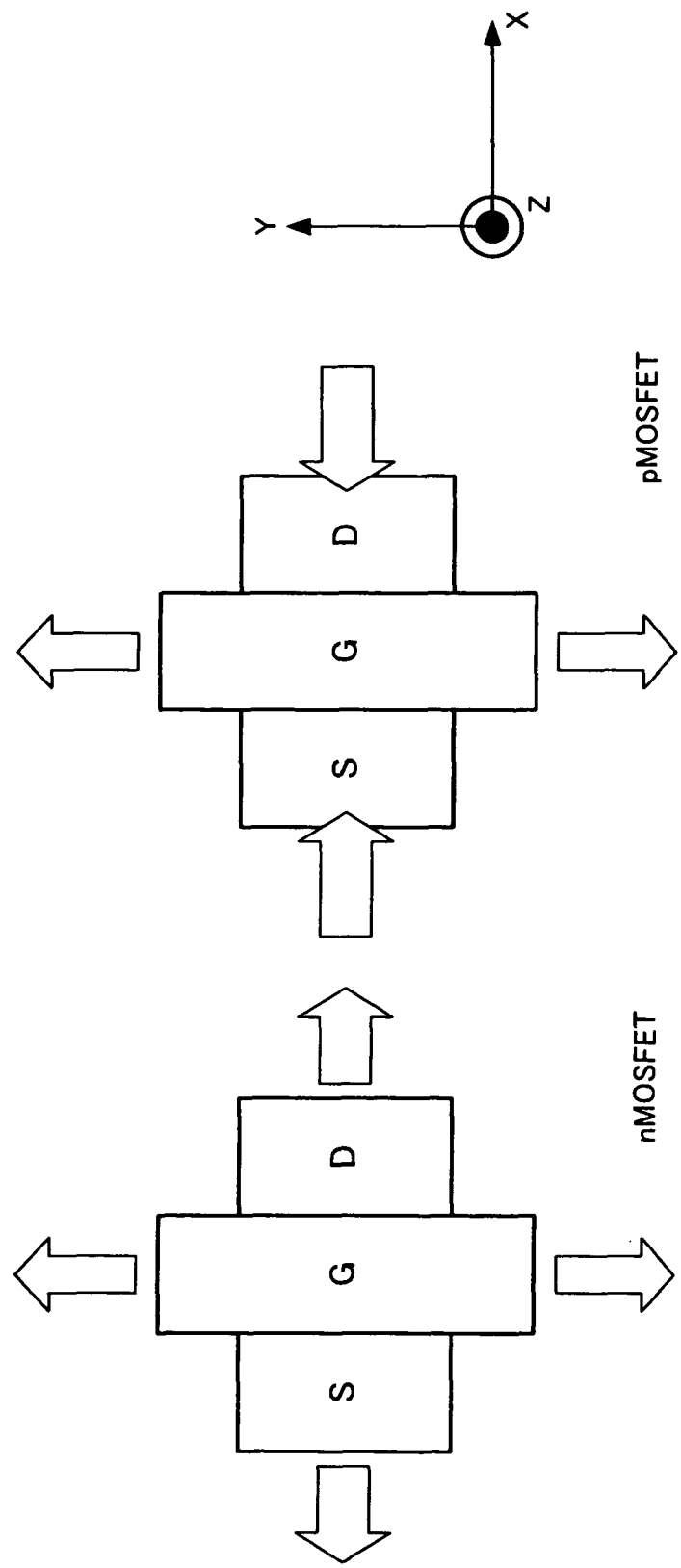
FIG. 20 illustrates a direction of applying a stress for increasing a carrier mobility in a semiconductor device having strained Si used as a channel.
Figure 21:
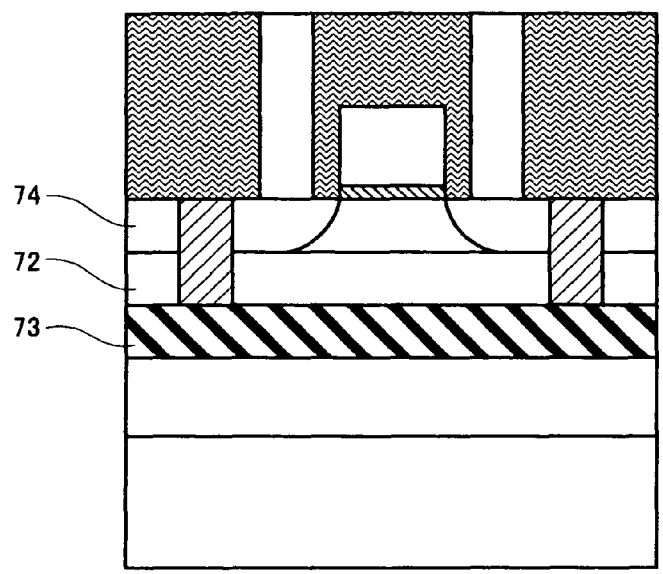
FIG. 21 is a conceptual view illustrating a semiconductor device having strained Si used as a channel in JP09-321307A.
Figure 22:
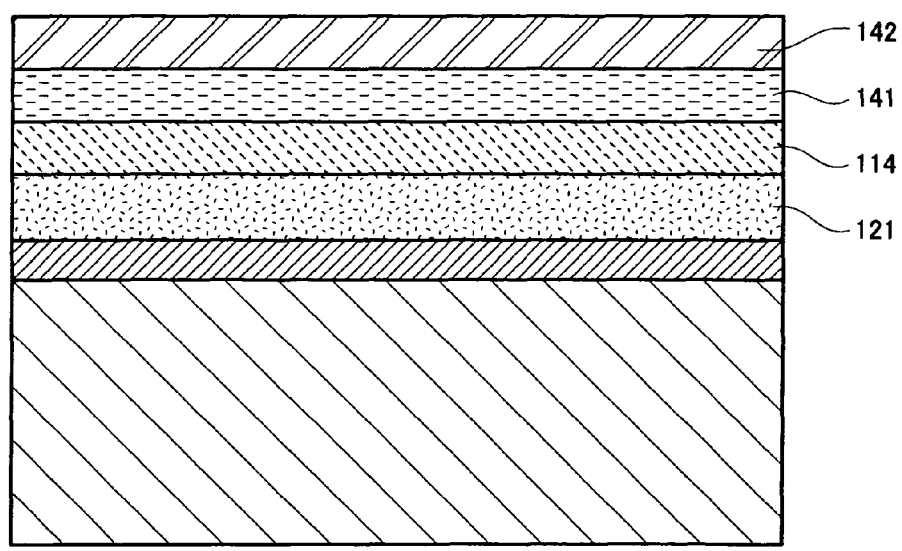
FIG. 22 is a conceptual view illustrating a semiconductor device having strained Si used as a channel in JP2003-078116A.
Figure 23:
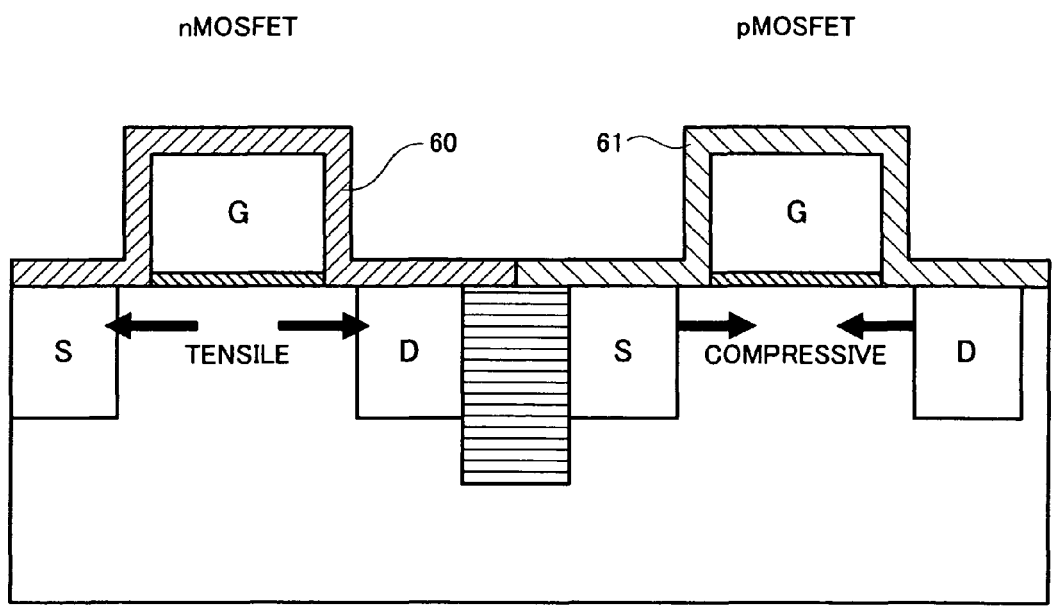
FIG. 23 is a conceptual view illustrating a semiconductor device having strained Si used as a channel in JP2005-005633A.

As described above in regard to the conventional art with reference to FIG. 20, an nMOSFET and a pMOSFET are different from each other in a direction of applying a stress for increasing a carrier mobility. More specifically, as for the nMOSFET, when a tensile stress is applied to a channel region in a gate length direction extending from a source (S) toward a drain (D) (an X direction: a [110] direction in this case) on a main surface of an Si substrate and a tensile stress is applied to the channel region in a direction perpendicular to the gate length direction (a Y direction: [−110] direction in this case) on the main surface of the Si substrate, a mobility is increased. On the other hand, as for the pMOSFET, when a compressive stress is applied to a channel region in a gate length direction extending from a source (S) toward a drain (D) (an X direction: a [110] direction in this case) on the main surface of the Si substrate and a tensile stress is applied to the channel region in a direction perpendicular to the gate length direction (a Y direction: a [−110] direction in this case) on the main surface of the Si substrate, a mobility is increased. Based on this fact, the first embodiment of the present invention adopts the following means in anticipation of generation of a stress by a low thermal expansion coefficient film in a package manufacturing process. That is, in a semiconductor chip manufacturing process, different strains are applied to a channel region of an nMOSFET and that of a pMOSFET on the main surface of the Si substrate. A sum of components of stresses turns into a tensile stress to be applied in a gate length direction of the nMOSFET, a tensile stress to be applied in a direction perpendicular to the gate length direction of the nMOSFET, a compressive stress to be applied in a gate length direction of the pMOSFET and a tensile stress to be applied in a direction perpendicular to the gate length direction of the pMOSFET.

Figure 4A:
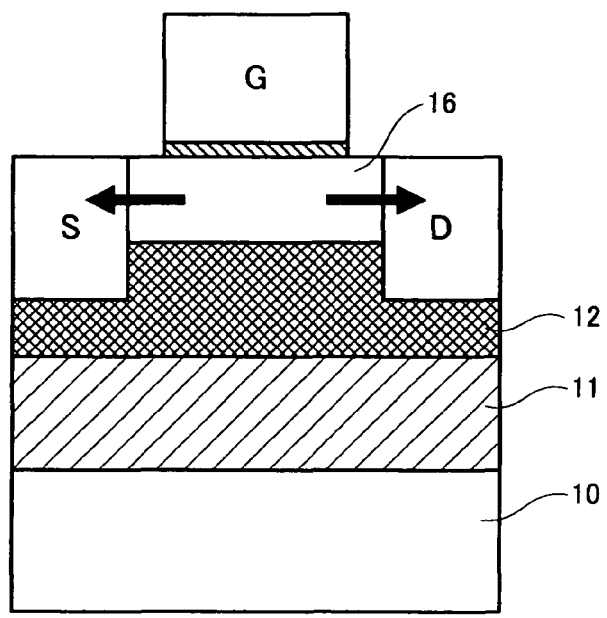
FIGS. 4A and 4B respectively illustrate a sectional structure of an nMOSFET and a direction of a stress in the first embodiment of the present invention.
Figure 4B:
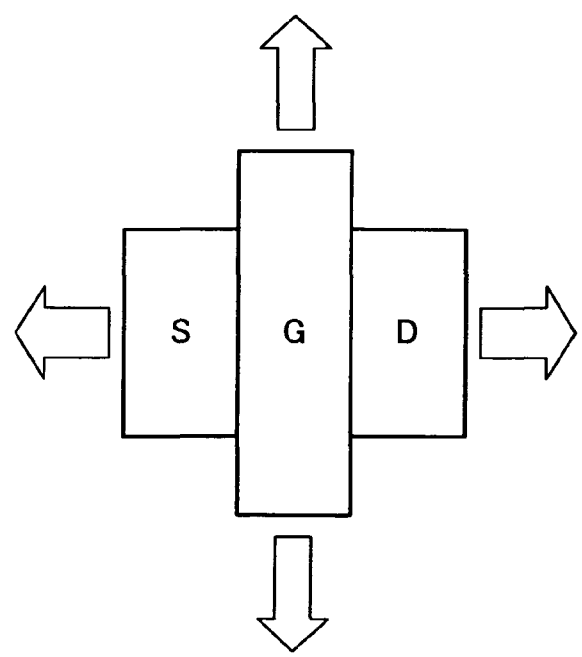

More specifically, a structure for giving a uniaxial strain (that is, a uniaxial stress) or a biaxial strain (that is, a biaxial stress) to a channel region on a main surface of an Si substrate in the semiconductor chip manufacturing process is prepared for each of the nMOSFET and the pMOSFET which are in the resultant Si chip 1. In the first embodiment of the present invention, a structure for generating tensile stresses in a gate length direction of a channel region and in a direction perpendicular thereto on a main surface of an Si substrate is prepared for the nMOSFET in the semiconductor chip manufacturing process. As illustrated in FIG. 4A (a sectional view), a strained Si 16 grown on an SiGe crystal 12 subjected to lattice relaxation as in the conventional art is used as a channel region; thus, a biaxial tensile strain is generated. In FIG. 4A, an arrow represents a direction of a generated stress. Moreover, in FIG. 4B (a top view), an arrow represents a direction of a generated biaxial tensile stress. Also as illustrated in FIG. 4A, an inclined-type SiGe buffer layer 11 having a Ge concentration increased from 0% to x% (x: a desired value) is epitaxially grown on an Si substrate 10. Further, the SiGe crystal 12 subjected to lattice relaxation is epitaxially grown on the inclined-type SiGe buffer layer 11. Thus, the SiGe crystal 12 has a lattice constant higher than that of an Si crystal. When Si is epitaxially grown on the SiGe crystal 12, a lattice constant of an Si crystal thus formed becomes higher than that of a normal Si crystal so as to match with a lattice constant of the SiGe crystal 12. In other words, a lattice spacing of the Si crystal is two-dimensionally widened. Therefore, the strained Si 16 can generate tensile stresses in the gate length direction and the direction perpendicular thereto, that is, can generate a biaxial tensile strain. The strained Si 16 is used as a channel.

Figure 5A:
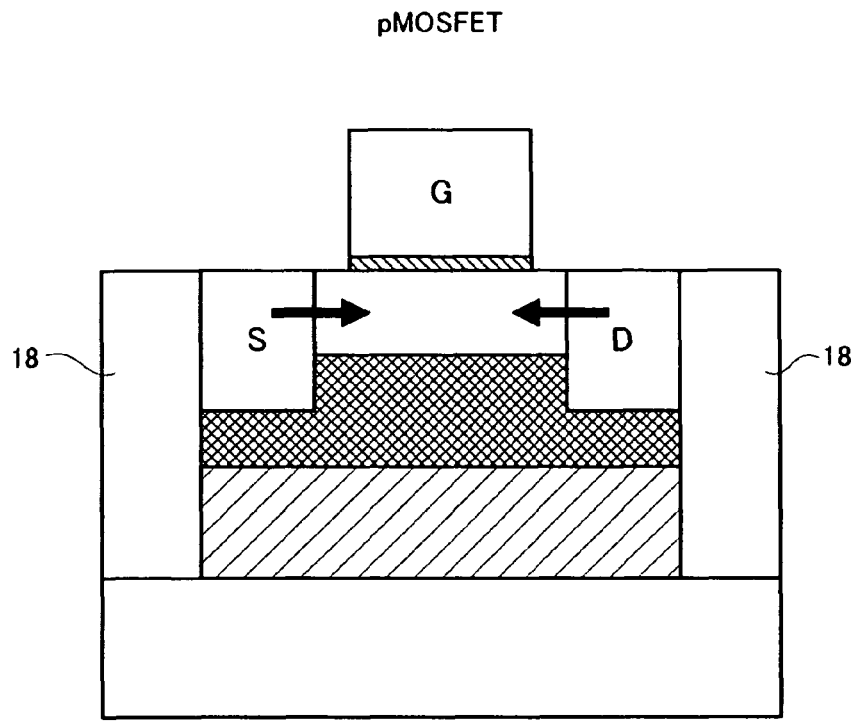
FIGS. 5A and 5B respectively illustrate a sectional structure of a pMOSFET and a direction of a stress in the first embodiment of the present invention.
Figure 5B:
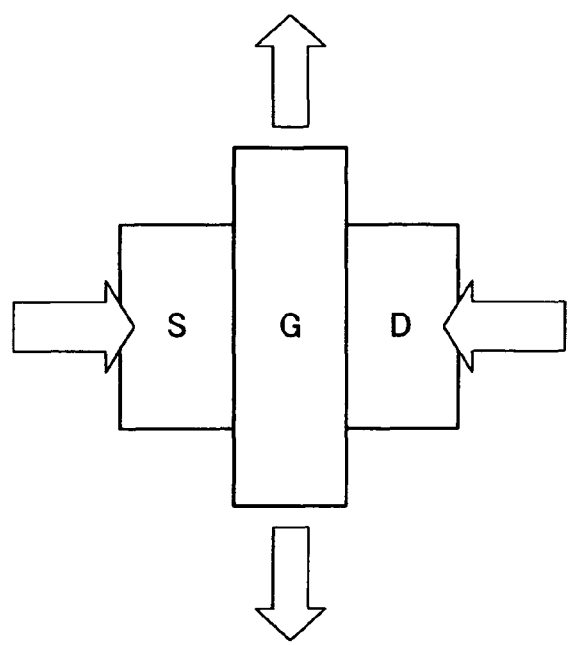

Also in the pMOSFET, similarly to the case of the nMOSFET, Si is epitaxially grown on an SiGe crystal to form a strained Si that generates a biaxial tensile strain, and the strained Si is used as a channel. In addition to this structure, as illustrated in FIG. 5A (a sectional view), buried-type strain induction structures 18 each generating a compressive stress in a gate length direction of a channel region on a main surface of an Si substrate are formed on both sides of the pMOSFET, in order to cancel a tensile stress generated in the gate length direction, thereby to obtain the compressive stress in the gate length direction for improving the mobility of the pMOSFET. In FIG. 5A, an arrow represents a direction of a generated stress. In FIG. 5B (a top view), arrows represent a direction of a generated tensile stress and a direction of a generated compressive stress. Also as illustrated in FIG. 5A, the buried-type strain induction structure 18 is made of $SiO_2$. Thus, a uniaxial compressive strain is applied in the gate length direction. On the other hand, a structure for generating a tensile stress in a gate width direction perpendicular to the gate length direction of the channel region on the main surface of the Si substrate can be prepared in the semiconductor chip manufacturing process.

The Ge concentration of the SiGe crystal subjected to lattice relaxation, and the shape, area and thickness of the low thermal expansion coefficient film are controlled in order that a sum of components of the stress derived from the formation of the buried-type strain induction structure in the semiconductor chip manufacturing process and generated on the channel region of the nMOSFET mounted on the Si chip, components of the stress derived from the formation of the buried-type strain induction structure in the semiconductor chip manufacturing process and generated on the channel region of the pMOSFET mounted on the Si chip, components of the stress derived from the formation of the low thermal expansion coefficient film in the package manufacturing process and generated on the channel region of the nMOSFET mounted on the Si chip and components of the stress derived from the formation of the low thermal expansion coefficient film in the package manufacturing process and generated on the channel region of the pMOSFET mounted on the Si chip turns into a tensile stress to be applied to the nMOSFET in the gate length direction of the channel region on the main surface of the Si substrate, a tensile stress to be applied to the nMOSFET in the direction perpendicular to the gate length direction, a compressive stress to be applied to the pMOSFET in the gate length direction of the channel region on the main surface of the Si substrate and a tensile stress to be applied to the pMOSFET in the gate width direction perpendicular to the gate length direction. For example, the Ge concentration of the SiGe crystal subjected to lattice relaxation is set at 20%. Herein, the low thermal expansion coefficient film 2 is formed entirely on the circuit face of the Si chip 1.

An experiment was conducted based on the first embodiment of the present invention and the following results were obtained. Herein, samples of chips to be packaged are 100 in total, and measurement points in each packaged chip are 30 in total. A carrier mobility of the nMOSFET was increased by 7% (an average value), and a carrier mobility of the pMOSFET was increased by 4.5% (an average value).

In the first embodiment of the present invention, the material having a low coefficient of thermal expansion is SiC, but may be $SiO_2$, SiOC, SiN or SiCN. Also in the first embodiment of the present invention, the thickness of the low thermal expansion coefficient film is set at 100 nm. This thickness depends on the thickness of the Si chip and the material having a low coefficient of thermal expansion. Therefore, it is effective that this thickness approximately falls within a range from 30% to 200% of the thickness of the Si chip.

Herein, the main surface of the Si substrate is substantially a {100} plane, and the gate length direction of the gate electrode in the MOSFET is substantially a <011> direction.

Figure 6:
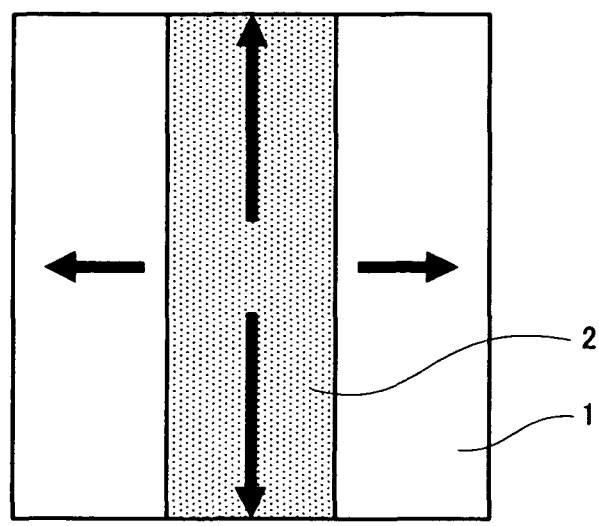
FIG. 6 illustrates a MOSFET having a low thermal expansion coefficient film formed partially thereon in the first embodiment of the present invention.

In the first embodiment of the present invention, the low thermal expansion coefficient film is formed entirely on the circuit face of the Si chip, but may be formed partially on the circuit face of the Si chip. For example, as illustrated in FIG. 6 (a top view), the low thermal expansion coefficient film 2 is formed on the Si chip 1 so as to extend from end to end of the Si chip 1 in the gate width direction of the pMOSFET and to extend by a predetermined width from a center of the Si chip 1 in the gate length direction of the pMOSFET. As a result, magnitude of the tensile stress derived from the formation of the low thermal expansion coefficient film 2 and generated in the gate length direction of the pMOSFET is relieved; thus, the mobility of the pMOSFET is further improved. In FIG. 6, an arrow represents a direction of a generated tensile stress. Also in the first embodiment of the present invention, the buried-type strain induction structure is made of $SiO_2$. Herein, a piezoelectric element may be used instead of the buried-type strain induction structure. In addition, a voltage to be applied to a piezoelectric element film is controlled, so that magnitude of the compressive stress can be controlled.

In the semiconductor chip manufacturing process, when the temperature is increased from the normal temperature to the sealing temperature with a resin, that is, 180° C., the Si chip is warped downward in a convex shape in some cases because the frame made of Cu has a coefficient of thermal expansion higher than that of Si chip. Herein, the low thermal expansion coefficient film should be formed on the Si chip in consideration of the warpage in order to improve adhesiveness between the low thermal expansion coefficient film and the Si chip.

As described above, in a semiconductor device in which strained Si is grown as a channel region on an SiGe substrate subjected to lattice relaxation, the following package structure can be realized. That is, in a package manufacturing process, a low thermal expansion coefficient film is formed on a circuit face of an Si chip. Meanwhile, in a semiconductor chip manufacturing process, a buried-type strain induction structure facing a gate length direction of a pMOSFET is formed to cancel a tensile stress generated in the gate length direction, thereby to obtain a compressive stress for improving a mobility of the pMOSFET in the gate length direction.

Thus, the compressive stress in the gate length direction can be obtained. Further, distribution and magnitude of a desired stress can be secured for a channel region of a MOSFET in a mounted chip even after performance of the package manufacturing process. As a result, a mobility is increased and current driving power is enhanced.

Second Embodiment

FIG. 7 is a sectional view illustrating a semiconductor device according to a second embodiment of the present invention. Herein, as an example, the semiconductor device has a package structure of a P-CSP (Plastic Chip-Size Package) type. This package structure is obtained as follows. An nMOSFET and a pMOSFET are mounted on a circuit face of an Si chip 1. Further, a thin film 23 made of a material having a coefficient of thermal expansion lower than that of Si (hereinafter, referred to as "low thermal expansion coefficient film") is formed entirely or partially on the circuit face of the Si chip 1. The resultant Si chip 1 is attached to a substrate 21 through an underfill resin agent 22 by flip-chip connection such that the circuit face of the Si chip 1 faces the substrate 21. In FIG. 7, arrows represent a compressive stress and a tensile stress each generated in a case that the low thermal expansion coefficient film 23 is not formed on the circuit face of the Si chip 1. When the low thermal expansion coefficient film 23 is formed on the circuit face of the Si chip 1, the compressive stress on the circuit face of the Si chip 1 changes to a tensile stress.

Figure 9:
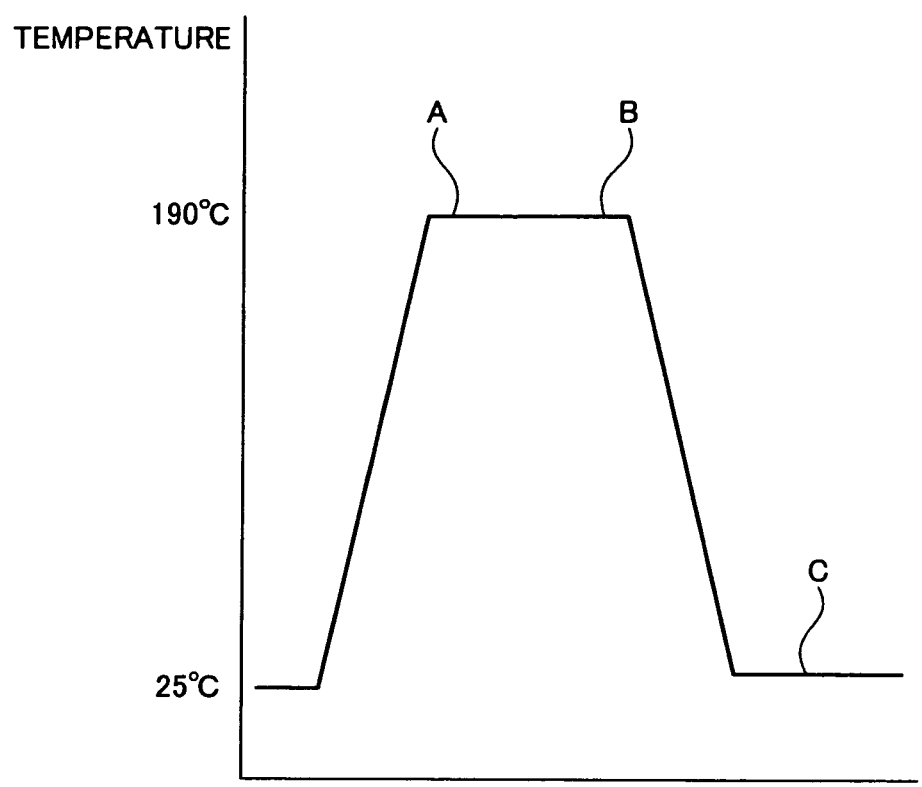
FIG. 9 shows a thermal history in the package manufacturing process of the semiconductor device according to the second embodiment of the present invention.

FIGS. 8A to 8C are sectional views each illustrating a package manufacturing process of the semiconductor device according to the second embodiment of the present invention. FIG. 9 shows a thermal history in the package manufacturing process of the semiconductor device according to the second embodiment of the present invention. As illustrated in FIGS. 8A and 8B, the Si chip 1 is raised in temperature from a normal temperature to a temperature at which the underfill resin agent 22 is softened. Herein, the temperature of the Si chip 1 is increased to 190° C. (a portion A in FIG. 9). With this temperature being kept, the low thermal expansion coefficient film 23 made of $SiO_2$ is formed on the circuit face of the Si chip 1 (a portion B in FIG. 9). On the low thermal expansion coefficient film 23, bumps are bared or formed in order to electrically connect between the Si chip 1 and the substrate 21. On the other hand, the underfill resin agent 22 is applied onto the substrate 21. Further, as illustrated in FIG. 8C, the Si chip 1 and the substrate 21 are attached to each other and, then, the temperature is decreased to the normal temperature (for example, 25° C., a portion C in FIG. 9). Herein, the low thermal expansion coefficient film 23 is formed on the circuit face of the Si chip 1 at an almost maximum temperature in the package manufacturing process.

If the low thermal expansion coefficient film 23 is not formed on the circuit face of the Si chip 1, the following disadvantage is caused. That is, when the temperature is decreased, a compressive strain is applied to the entire circuit face of the Si chip 1. Consequently, the compressive strain is also applied to a channel region of the nMOSFET and that of the pMOSFET. The reason therefor is as follows: the substrate 21 has a coefficient of thermal expansion higher than that of the Si chip 1 and, therefore, is warped upward in a convex shape. However, according to the second embodiment of the present invention, since the low thermal expansion coefficient film 23 having a coefficient of thermal expansion lower than that of Si is formed on the circuit face of the Si chip 1, the aforementioned warpage is prevented and a tensile strain is applied to the entire circuit face of the Si chip 1.

Figure 10:
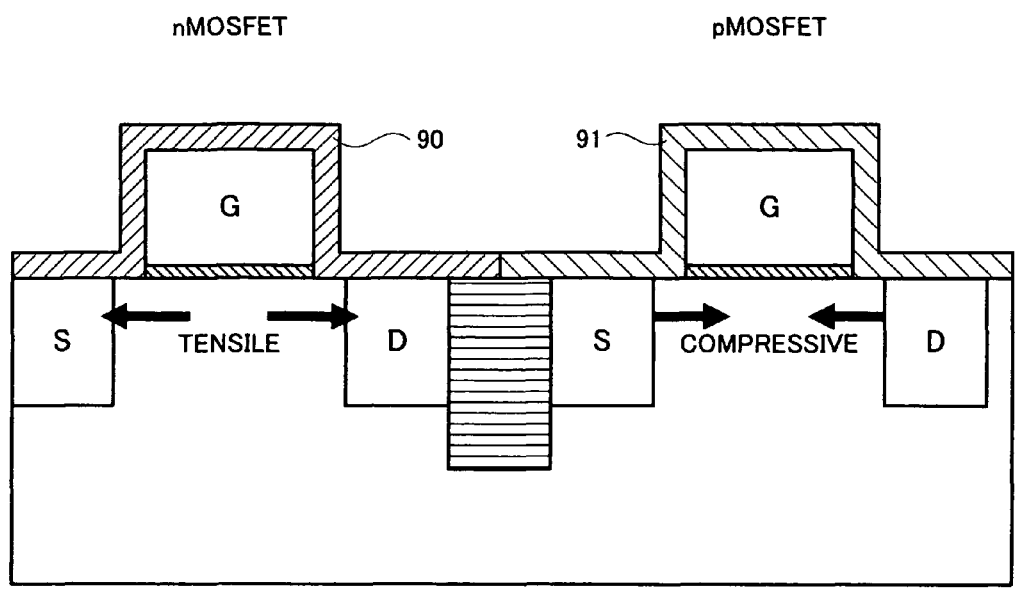
FIG. 10 is a sectional view illustrating a MOSFET having an internal stress film formed thereon in the second embodiment of the present invention.

For the nMOSFET mounted on the Si chip 1, a stress generation structure for generating a tensile stress in a gate length direction of a channel region on a main surface of an Si substrate is prepared in a semiconductor chip manufacturing process. More specifically, as illustrated in FIG. 10, an internal stress film 90 made of a silicon nitride is formed on a source region and a drain region; thus, a tensile stress is generated on a channel region in an electron moving direction. On the other hand, in the pMOSFET, an internal stress film 91 made of a TEOS is formed on a source region and a drain region; thus, a compressive stress is generated on a channel region in a hole moving direction, as illustrated in FIG. 10.

The shape, area and thickness of the internal stress film are controlled in order that a sum of components of the stress derived from the formation of the internal stress film in the semiconductor chip manufacturing process and generated on the channel region of the nMOSFET mounted on the Si chip, components of the stress derived from the formation of the internal stress film in the semiconductor chip manufacturing process and generated on the channel region of the pMOSFET mounted on the Si chip, components of the stress derived from the formation of the low thermal expansion coefficient film in the package manufacturing process and generated on the channel region of the nMOSFET mounted on the Si chip and components of the stress derived from the formation of the low thermal expansion coefficient film in the package manufacturing process and generated on the channel region of the pMOSFET mounted on the Si chip turns into a tensile stress to be applied to the nMOSFET in the gate length direction of the channel region on the main surface of the Si substrate, a tensile stress to be applied to the nMOSFET in the direction perpendicular to the gate length direction, a compressive stress to be applied to the pMOSFET in the gate length direction of the channel region on the main surface of the Si substrate and a tensile stress to be applied to the pMOSFET in the gate width direction perpendicular to the gate length direction. Specifically, the thickness of the internal stress film is set at 30 nm. Further, the internal stress film is formed so as to cover all of a source region, a gate region and a drain region.

An experiment was conducted based on the second embodiment of the present invention and the following results were obtained. Herein, samples of chips to be packaged are 120 in total, and measurement points in each packaged chip are 35 in total. A carrier mobility of the nMOSFET was increased by 5.5% (an average value), and a carrier mobility of the pMOSFET was increased by 4.3% (an average value).

It was effective that the thickness of the internal stress film falls within a range from 10 nm to 50 nm. Herein, similarly to the first embodiment of the present invention, the main surface of the Si substrate is substantially a {100} plane, and the gate length direction of the gate electrode in the MOSFET is substantially a <011> direction.

As described above, the following package structure can be realized. That is, a low thermal expansion coefficient film is formed on a circuit face of an Si chip in a package manufacturing process. Meanwhile, an inner stress film for obtaining a tensile stress for improving a mobility of an nMOSFET in a gate length direction and an inner stress film for obtaining a compressive stress for improving a mobility of a pMOSFET in a gate length direction are formed in a semiconductor chip manufacturing process. Thus, distribution and magnitude of a desired stress can be secured for a channel region of a MOSFET in a mounted chip even after performance of the package manufacturing process. As a result, a mobility is increased and current driving power is enhanced.

Third Embodiment

Figure 11:
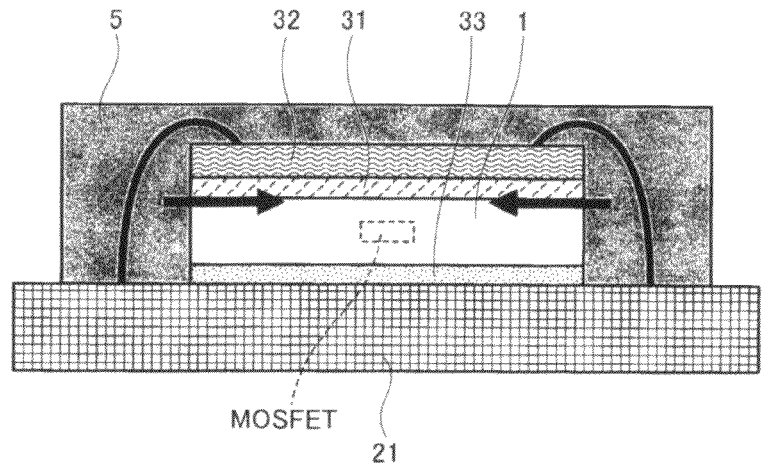
FIG. 11 is a sectional view illustrating a semiconductor device according to a third embodiment of the present invention.

FIG. 11 is a sectional view illustrating a semiconductor device according to a third embodiment of the present invention. Herein, as an example, the semiconductor device has a package structure of a P-BGA (Plastic Ball Grid Array) package type. This package structure is obtained as follows. An nMOSFET and a pMOSFET are mounted on a circuit face of an Si chip 1. Further, a piezoelectric element film 31, and a thin film 32 made of a material having a coefficient of thermal expansion lower than that of Si (hereinafter, referred to as "low thermal expansion coefficient film") are formed entirely or partially on the circuit face of the Si chip 1. The resultant Si chip 1 is attached to a substrate 21 through a die bonding agent 33. Then, the Si chip 1 and the substrate 21 are integrally sealed with a resin 5. In FIG. 11, an arrow represents a compressive stress generated on the circuit face of the Si chip 1 in a case that the low thermal expansion coefficient film 32 is not formed on the circuit face of the Si chip 1. When the low thermal expansion coefficient film 32 is formed on the circuit face of the Si chip 1, the compressive stress on the circuit face of the Si chip 1 changes to a tensile stress.

Figure 12A:
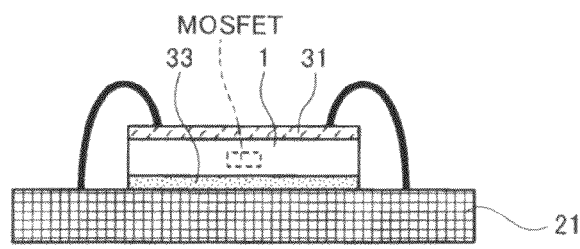
FIGS. 12A to 12C are sectional views each illustrating a package manufacturing process of the semiconductor device according to the third embodiment of the present invention.
Figure 12B:
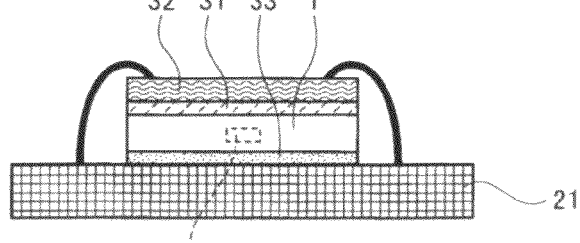
Figure 12C:
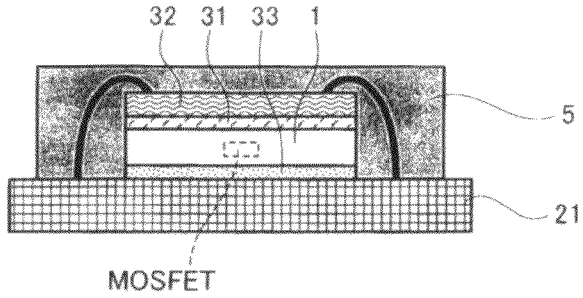
Figure 13:
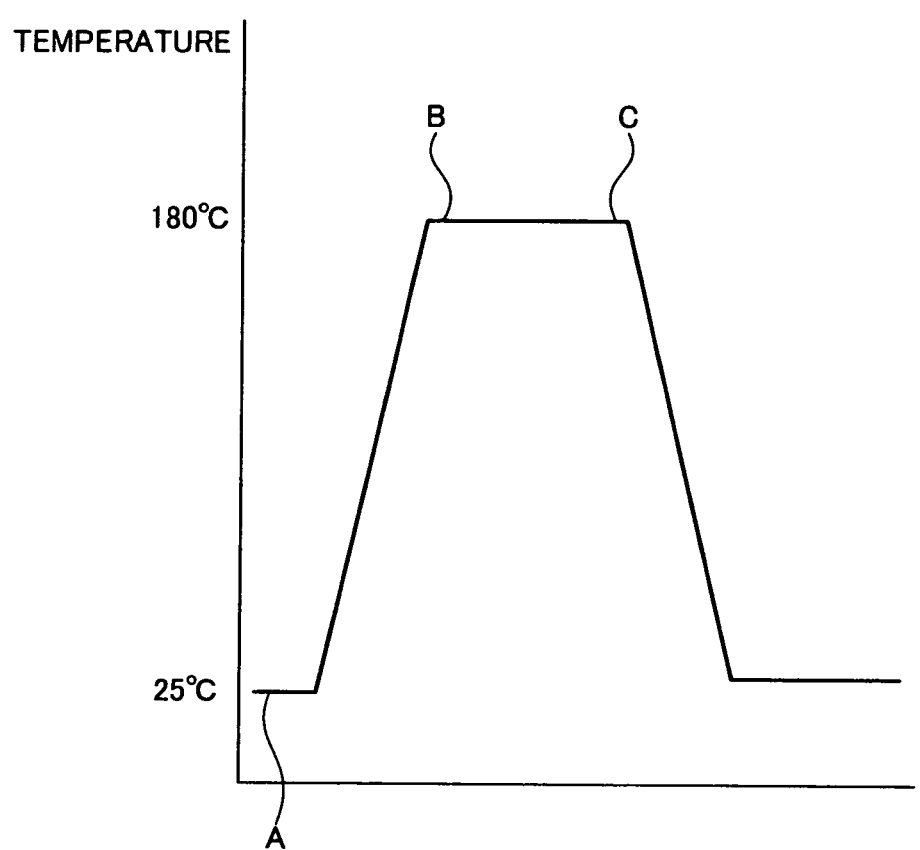
FIG. 13 shows a thermal history in the package manufacturing process of the semiconductor device according to the third embodiment of the present invention.
Figure 14:
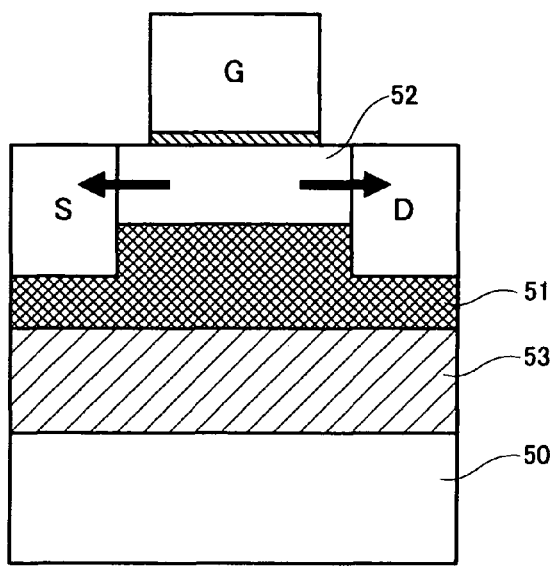
FIG. 14 schematically illustrates a conventional semiconductor device having strained Si used as a channel.
Figure 15:
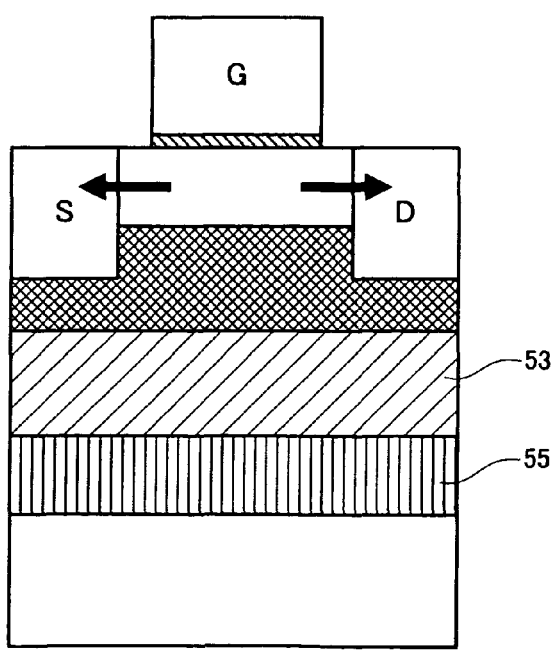
FIG. 15 schematically illustrates the conventional semiconductor device having the strained Si used as a channel with a buried insulating layer.
Figure 16:
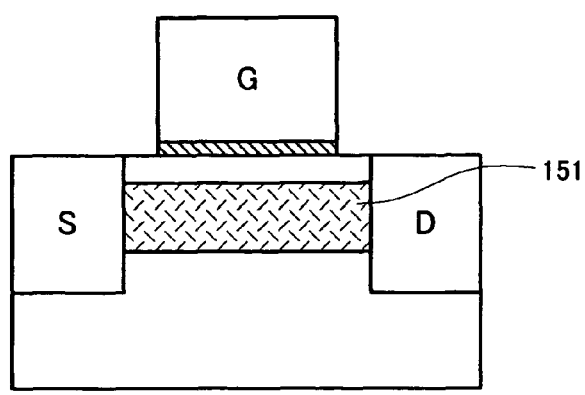
FIG. 16 schematically illustrates a conventional semiconductor device having SiGe used as a channel.
Figure 17:
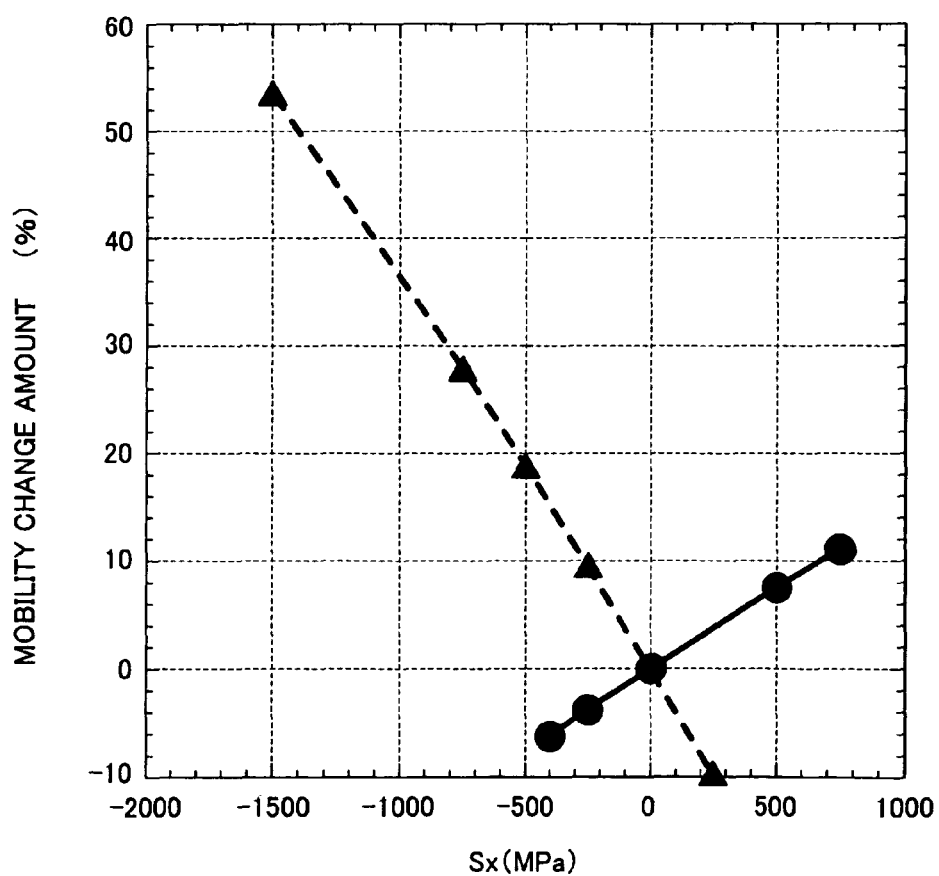
FIG. 17 shows a relation between an stress in an X direction and a change amount of a mobility with respect to a semiconductor device having strained Si used as a channel.
Figure 18:
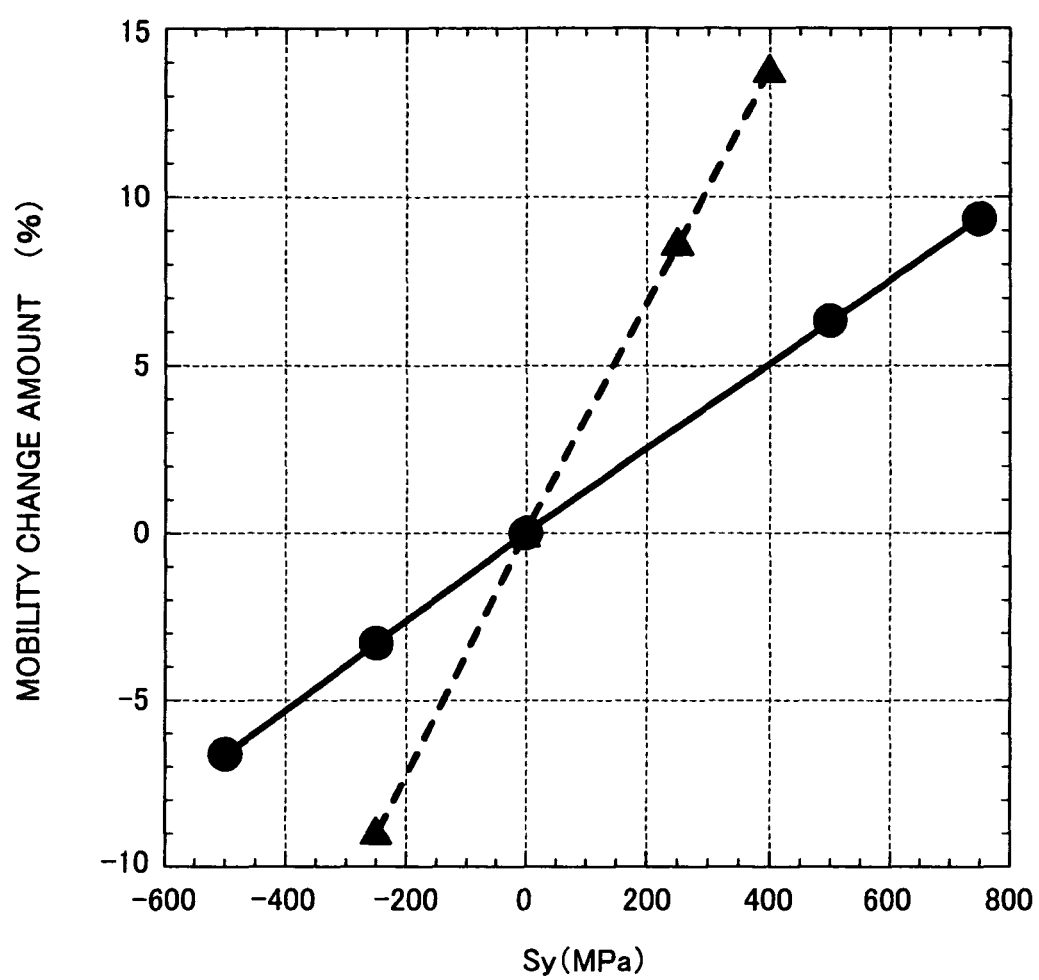
FIG. 18 shows a relation between an stress in a Y direction and a change amount of a mobility with respect to a semiconductor device having strained Si used as a channel.
Figure 19:
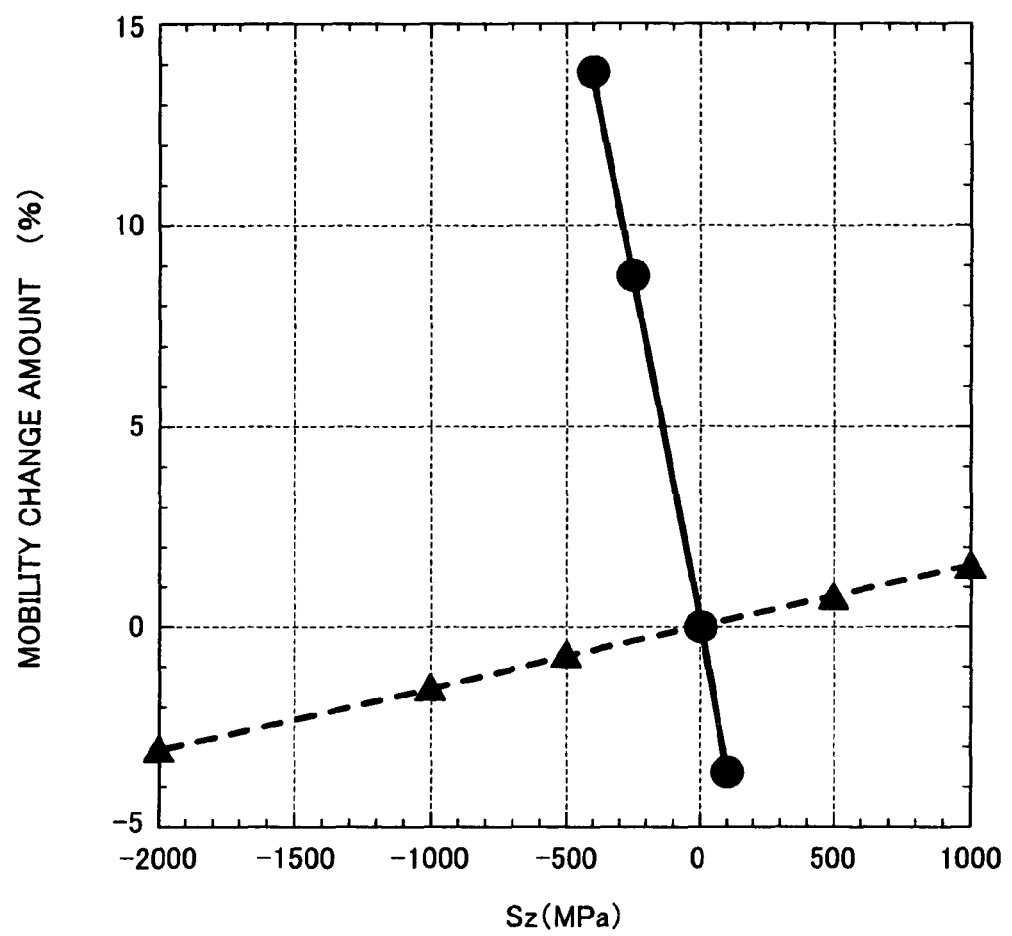
FIG. 19 shows a relation between an stress in a Z direction and a change amount of a mobility with respect to a semiconductor device having strained Si used as a channel.

FIGS. 12A to 12C are sectional views each illustrating a package manufacturing process of the semiconductor device according to the third embodiment of the present invention. FIG. 13 shows a thermal history in the package manufacturing process of the semiconductor device according to the third embodiment of the present invention. As illustrated in FIG. 12A, the Si chip 1 is attached to the substrate 21 at a normal temperature (for example, 25° C., a portion A in FIG. 13). Further, the piezoelectric element film 31 made of ZnO is formed on the Si chip 1. Thereafter, as illustrated in FIG. 12B, the Si chip 1 attached to the substrate 21 is raised in temperature to a sealing temperature with a resin. Herein, the temperature of the Si chip 1 is increased to 180° C. (a portion B in FIG. 13). With this temperature being kept, the low thermal expansion coefficient film 32 made of SiCN is formed on the piezoelectric element film 31 formed on the circuit face of the Si chip 1 (a portion C in FIG. 13). As illustrated in FIG. 12C, the Si chip 1, the piezoelectric element film 31, the low thermal expansion coefficient film 32 and the substrate 21 are integrally sealed with the resin 5 and, then, the temperature is decreased to the normal temperature (for example, 25° C.). Herein, the low thermal expansion coefficient film 32 is formed on the circuit face of the Si chip 1 at an almost maximum temperature in the package manufacturing process.

If the low thermal expansion coefficient film 32 is not formed on the circuit face of the Si chip 1, a compressive strain is applied to the entire circuit face of the Si chip 1 due to shrinkage on curing of the resin 5. Consequently, the compressive strain is also applied to a channel region of the nMOSFET and that of the pMOSFET. However, according to the third embodiment of the present invention, since the low thermal expansion coefficient film 32 is formed on the circuit face of the Si chip 1, a tensile strain is applied to the entire circuit face of the Si chip 1. Further, since the piezoelectric element film 31 is formed on the circuit face of the Si chip 1, a compressive strain is applied to the channel region of the nMOSFET and that of the pMOSFET in a direction perpendicular to a main surface of an Si substrate. In particular, a mobility of the nMOSFET is increased. Moreover, a structure to which a voltage is applied is formed on and below the piezoelectric element film 31 in a thickness direction and a voltage to be applied to the piezoelectric element film 31 is controlled, so that magnitude of the compressive stress generated in the direction perpendicular to the main surface of the Si substrate can be controlled.

For the nMOSFET mounted on the Si chip 1, a structure for generating a tensile stress in a gate length direction of a channel region on a main surface of an Si substrate is prepared in a semiconductor chip manufacturing process. More specifically, as illustrated in FIG. 10, an internal stress film 90 made of a silicon nitride is formed on a source region and a drain region; thus, a tensile stress is generated on a channel region in an electron moving direction. On the other hand, in the pMOSFET, an internal stress film 91 made of a TEOS is formed on a source region and a drain region; thus, a compressive stress is generated on a channel region in a hole moving direction, as illustrated in FIG. 10.

The shape, area and thickness of the internal stress film are controlled in order that a sum of components of the stress derived from the formation of the internal stress film in the semiconductor chip manufacturing process and generated on the channel region of the nMOSFET mounted on the Si chip, components of the stress derived from the formation of the internal stress film in the semiconductor chip manufacturing process and generated on the channel region of the pMOSFET mounted on the Si chip, components of the stress derived from the formation of the low thermal expansion coefficient film in the package manufacturing process and generated on the channel region of the nMOSFET mounted on the Si chip and components of the stress derived from the formation of the low thermal expansion coefficient film in the package manufacturing process and generated on the channel region of the pMOSFET mounted on the Si chip turns into a tensile stress to be applied to the nMOSFET in the gate length direction of the channel region on the main surface of the Si substrate, a tensile stress to be applied to the nMOSFET in the direction perpendicular to the gate length direction, a compressive stress to be applied to the pMOSFET in the gate length direction of the channel region on the main surface of the Si substrate and a tensile stress to be applied to the pMOSFET in the gate width direction perpendicular to the gate length direction. Specifically, the thickness of the internal stress film is set at 20 nm. Further, the internal stress film is formed so as to cover all of a source region, a gate region and a drain region. In the third embodiment of the present invention, further, a compressive stress derived from the formation of the piezoelectric element film in the package manufacturing process is applied in a direction perpendicular to the main surface of the Si substrate. Thus, a mobility of the nMOSFET is especially increased.

An experiment was conducted based on the third embodiment of the present invention and the following results were obtained. Herein, samples of chips to be packaged are 120 in total, and measurement points in each packaged chip are 35 in total. A carrier mobility of the nMOSFET was increased by 7.5% (an average value), and a carrier mobility of the pMOSFET was increased by 4.8% (an average value).

It was effective that the thickness of the internal stress film falls within a range from 10 nm to 50 nm. Herein, the piezoelectric element film is made of ZnO, but may be made of PZT (Pb(Zr,Ti)O$_3$), AlN or LiNbO$_3$.

Herein, similarly to the first embodiment of the present invention, the main surface of the Si substrate is substantially a {100} plane, and the gate length direction of the gate electrode in the MOSFET is substantially a <011> direction.

As described above, the following package structure can be realized. That is, when a low thermal expansion coefficient film is formed on a circuit face of an Si chip and a piezoelectric element film is formed on the Si chip in a package manufacturing process, a compressive stress is applied to a main surface of an Si substrate in a vertical direction. In particular, a mobility of an nMOSFET is increased. Therefore, distribution and magnitude of a desired stress can be secured for a channel region of a MOSFET in a mounted chip even after performance of the package manufacturing process. As a result, a mobility is increased and current driving power is enhanced.

Further, the following package structure can be realized. That is, an inner stress film for obtaining a tensile stress for improving a mobility of an nMOSFET in a gate length direction and an inner stress film for obtaining a compressive stress for improving a mobility of a pMOSFET in a gate length direction are formed in a semiconductor chip manufacturing process. Thus, distribution and magnitude of a desired stress can be secured for a channel region of a MOSFET in a mounted chip even after performance of the package manufacturing process. As a result, a mobility is increased and current driving power is enhanced.

What is claimed is:

1. A semiconductor device comprising:
   a Si chip;
   a MOSFET formed in the Si chip; and
   a low thermal expansion coefficient film formed on the Si chip, the low thermal expansion coefficient film having a coefficient of thermal expansion lower than that of Si,
   wherein the Si chip is attached to one of a substrate or a frame and sealed with a resin, as a package,
   the MOSFET includes a stress generation structure for generating a tensile stress in a gate length direction and generating a tensile stress in a gate width direction perpendicular to the gate length direction, and
   the stress generation structure includes a strained Si channel region grown on an SiGe crystal subjected to lattice relaxation, and buried-type strain induction structures for generating compressive stress in the gate length direction at both sides of a source region and a drain region of the MOSFET in the gate width direction.

2. The semiconductor device according to claim 1, wherein the low thermal expansion coefficient film extends from end to end of the Si chip in the gate width direction of the MOSFET and extends a predetermined width from a center of the Si chip in the gate length direction of the MOSFET.

3. The semiconductor device according to claim 1, wherein the Si chip is a {100} plane and a gate length direction is a <011> direction.

4. The semiconductor device according to claim 1, wherein the low thermal expansion coefficient film is made of a material selected from a group consisting of SiO$_2$, SiOC, SiN, SiC and SiCN.

5. The semiconductor device according to claim 1, wherein the low thermal expansion coefficient film is formed on the Si chip at an almost maximum temperature in a package manufacturing process.

6. The semiconductor device according to claim 1, wherein the buried-type strain induction structure comprises a silicon oxide film and a piezoelectric element.

7. The semiconductor device according to claim 1, additionally comprising an internal stress film of a silicon nitride on a source region and a drain region of the MOSFET.

8. The semiconductor device according to claim 1, comprising a piezoelectric element on one of an entire region and a partial region of the Si chip.

9. The semiconductor device according to claim 1,
   wherein the low thermal expansion coefficient film is spaced apart from the source region and the drain region.

10. The semiconductor device according to claim 1, wherein the MOSFET comprises an n-type MOSFET and a p-type MOSFET, the semiconductor device further comprising:
- a first source region and a first drain region in the n-type MOSFET;
- a second source region and a second drain region in the p-type MOSFET;
- a silicon nitride film on the first source region and the first drain region; and
- a TEOS film on the second source region and the second drain region.

11. The semiconductor device according to claim 1, wherein the low thermal expansion coefficient film has an upper surface, a side surface and a lower surface, the lower surface being in contact with the Si chip, and the resin is in contact with the side surface and the upper surface of the low thermal expansion coefficient film.

12. The semiconductor device according to claim 1, wherein the low thermal expansion coefficient film is directly formed on the Si chip but spaced apart from the MOSFET.

13. A semiconductor device comprising:
- a Si chip;
- an n-type MOSFET and a p-type MOSFET formed in the Si chip;
- a low thermal expansion coefficient film formed on the Si chip, the low thermal expansion coefficient film having a coefficient of thermal expansion lower than that of Si;
- a silicon nitride film in contact with the n-type MOSFET;
- a TEOS film in contact with the p-type MOSFET; and
- a piezoelectric element film formed on the Si Chip and under the low thermal expansion coefficient film,
wherein the Si chip is attached to one of a substrate or a frame and sealed with a resin, as a package.

14. A semiconductor device comprising:
- a Si chip;
- an n-type MOSFET and a p-type MOSFET formed in the Si chip;
- a low thermal expansion coefficient film formed on the Si chip, the low thermal expansion coefficient film having a coefficient of thermal expansion lower than that of Si;
- a first source region and a first drain region in the n-type MOSFET;
- a second source region and a second drain region in the p-type MOSFET;
- a silicon nitride film in contact with the first source region and the first drain region;
- a TEOS film in contact with the second source region and the second drain region; and
- a piezoelectric element film formed on the Si Chip and under the low thermal expansion coefficient film,
wherein the Si chip is attached to one of a substrate or a frame and sealed with a resin, as a package.

* * * * *